United States Patent [19]

Nojiri et al.

[11] Patent Number: 5,172,207
[45] Date of Patent: Dec. 15, 1992

[54] SEMICONDUCTOR WAFER TO BE ETCHED ELECTROCHEMICALLY

[75] Inventors: Hidetoshi Nojiri; Makoto Uchiyama, both of Kanagawa, Japan

[73] Assignee: Nissan Motor Co., Ltd., Japan

[21] Appl. No.: 747,582

[22] Filed: Aug. 20, 1991

[30] Foreign Application Priority Data

Sep. 20, 1990 [JP] Japan ............................. 2-250527

[51] Int. Cl.$^5$ .......................................... H01L 27/14
[52] U.S. Cl. ................................. 257/254; 156/643; 156/901; 437/170; 437/921; 257/418; 257/419; 257/459; 257/461
[58] Field of Search ............. 357/30 P, 30 G, 26, 357/40; 156/901, 649, 662, 643; 437/170, 172, 921

[56] References Cited

U.S. PATENT DOCUMENTS

| 4,534,100 | 8/1985 | Lane | 437/172 X |
| 4,703,996 | 11/1987 | Glass et al. | 357/30 G X |
| 4,754,312 | 6/1988 | Langer et al. | 357/30 P |
| 5,069,749 | 12/1991 | Gutierrez | 156/662 X |

FOREIGN PATENT DOCUMENTS 59-46033  3/1984  Japan .

OTHER PUBLICATIONS

Gealer et al., "The Effect of an Interfacial P-N Junction on the Electrochemical Passivation of Silicon in Aqueous Ethylenediamine-Pyrocatechol", *Journal of the Electrochemical Society*, May 1988, pp. 1180–1183.

*Primary Examiner*—William Mintel
*Attorney, Agent, or Firm*—Lowe, Price, LeBlanc & Becker

[57] ABSTRACT

A semiconductor wafer including a plurality of chips having respective portions to be etched electrochemically with application of an electric voltage to the semiconductor wafer immersed in an etching solution. The semiconductor wafer includes electric circuits formed therein for controlling electric energy applied to the respective portions.

13 Claims, 9 Drawing Sheets

SEMICONDUCTOR WAFER TO BE ETCHED ELECTROCHEMICALLY

BACKGROUND OF THE INVENTION

This invention relates to a semiconductor wafer to be selectively etched electrochemically in an etching solution.

Various electrochemical etching methods have been utilized to produce accelerometers, pressure sensors or other semiconductor devices from a semiconductor wafer. One serious problem with conventional electrochemical etching methods is that the uneven distribution of currents and potentials in the semiconductor wafer is caused by the uneven distribution of electric force lines in the peripheral portion of the semiconductor wafer and the uneven distribution of flows of the etching solution to degrade the etching uniformity and accuracy.

SUMMARY OF THE INVENTION

Therefore, a main object of the invention is to provide an improved semiconductor wafer arrangement which can ensure uniform and accurate electrochemical etching.

There is provided, in accordance with the invention, a semiconductor wafer including a plurality of chips having respective portions to be etched electrochemically with application of an electric voltage to the semiconductor wafer immersed in an etching solution. The semiconductor wafer includes means formed therein for controlling electric energy applied to the respective portion.

BRIEF DESCRIPTION OF THE DRAWINGS

This invention will be described in greater detail by reference to the following description taken in connection with the accompanying drawings, in which like numerals refer to like parts in the several views and in which.

DETAILED DESCRIPTION OF THE INVENTION

Figure 13:
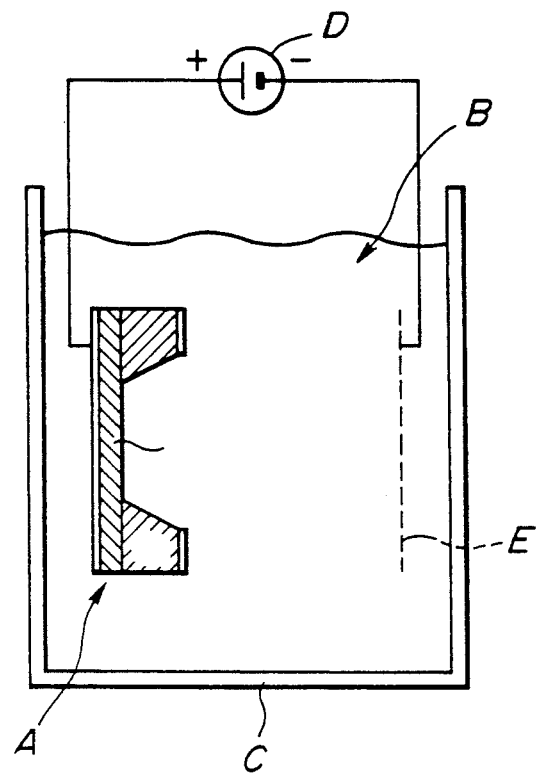
FIG. 13 is a schematic diagram showing a an electrochemical etching unit used with a conventional semiconductor wafer.
Figure 14A:
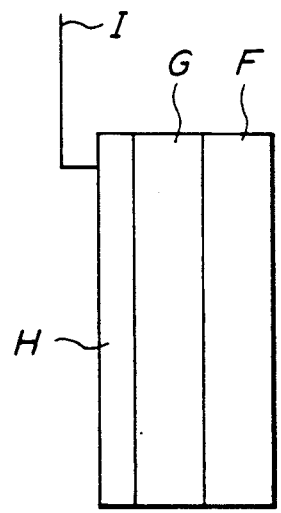
FIGS. 14A and 14B are diagrams showing conventional semiconductor wafers.
Figure 14B:
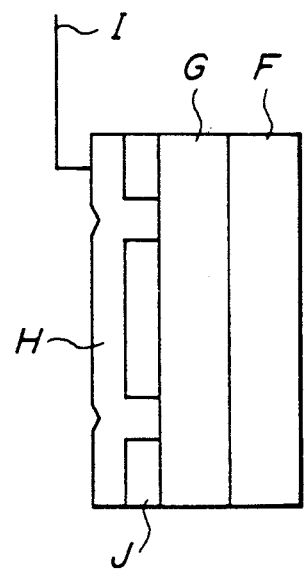
Figure 15A:
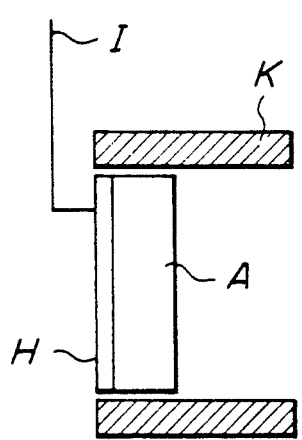
FIGS. 15A and 15B are sectional views showing conventional practices used to obtain uniform distribution of electric force lines in the conventional semiconductor wafer.
Figure 15B:
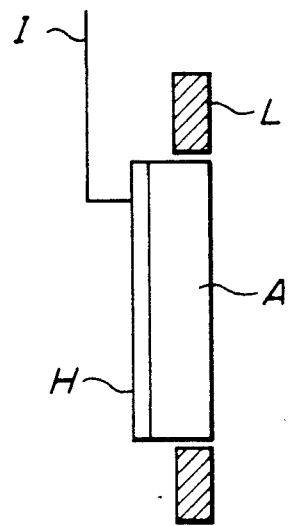

Prior to the description of the preferred embodiment of the invention, the prior art electrochemical etching methods of FIGS. 13 to 15 are briefly described in order to provide a basis for a better understanding of the difficulties attendant thereon.

In an article published May 1988, in Journal of Electrochemical Society, Vol. 135, No. 5 by R. L. Gealer et al. entitled "The Effect of an Interfacial P-N Junction on the Electrochemical Passivation of Silicon in Aqueous Ethylenediamine-Pyrocatechol", there is described a conventional electrochemical etching method where a semiconductor wafer A is immersed in an etching solution B contained in a vessel C. The etching solution B may be an alkaline etchant such as KOH or an acid etchant such as hydrofluorid. A voltage source D is provided to apply a DC voltage to the semiconductor wafer A to maintain it at a predetermined positive potential with respect to a counter-electrode E immersed in the etching solution B so as to etch the semiconductor wafer A.

FIG. 14A shows one type of semiconductor wafer which is comprised of p-type silicon substrate F having an n-type epitaxial layer G formed thereon. A metal conductive layer H is provided over the entire surface of the epitaxial layer G. The metal conductive layer H is connected through a lead wire I to the voltage source D (FIG. 13) to apply a DC voltage to the epitaxial layer G. FIG. 14B shows another type of semiconductor wafer which is comprised of p-type silicon substrate F having an n-type epitaxial layer G formed thereon. An insulating layer J is formed partially on the epitaxial layer F. A metal conductive layer H is provided partially on the surface of the insulating layer J and connected through a lead wire I to the voltage source D (FIG. 13) to apply a DC voltage to the epitaxial layer G.

One problem with the conventional electrochemical etching method is that the uneven distribution of currents and potentials in the semiconductor wafer A is caused by the uneven distribution of electric force lines in the peripheral portion of the semiconductor wafer A and the uneven distribution of flows of the etching solution B to degrade the etching uniformity and accuracy. This tendency increases as the diameter of the semiconductor wafer A increases.

In order to decrease the tendency of the concentration of electric force lines in the peripheral portion of the semiconductor wafer A, it has been proposed to surround the peripheral portion of the semiconductor wafer A with a cylindrical insulator K, as shown in FIG. 15A. It has also been proposed to obtain uniform distribution of electric force lines in the semiconductor wafer A by providing a ring-shaped auxiliary electrode L adjacent to the periphery of the semiconductor wafer A. However, the uneven distribution of currents and potentials remains in the semiconductor wafer A because of the uneven distribution of flows and temperatures of the etching solution B.

Figure 1:
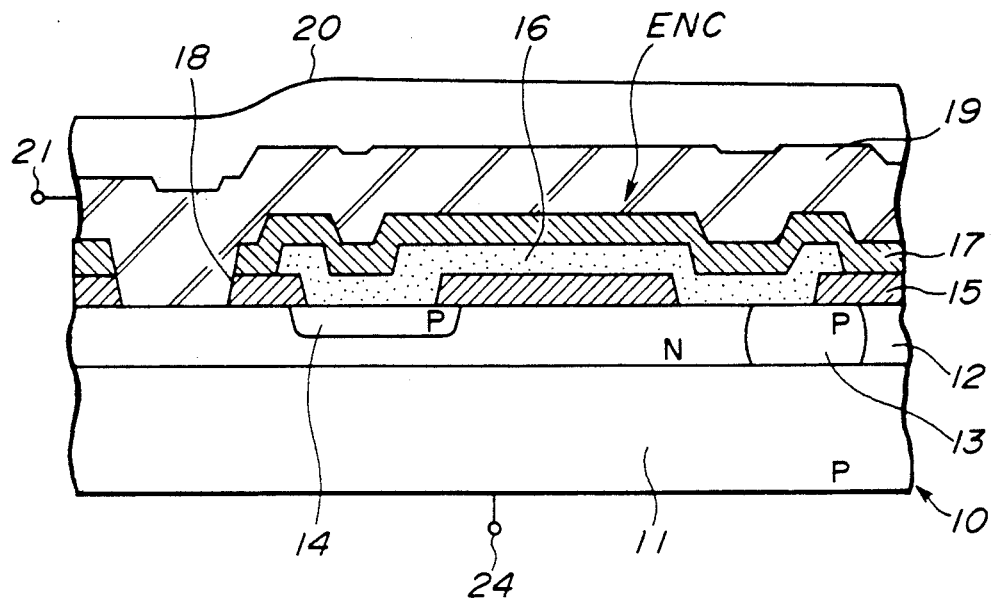
FIG. 1 is a fragmentary sectional view showing one embodiment of a semiconductor wafer made in accordance with the invention.

Referring to FIG. 1, there is shown a semiconductor wafer embodying the invention. The semiconductor wafer, generally designated by the numeral 10, includes a p-type silicon substrate 11 having an n-type silicon layer (epitaxial layer) 12 formed over the entire surface of the silicon substrate 11. The semiconductor wafer 10 also includes a p-type diffused region 13 formed in the n-type epitaxial layer 12 and a p-type diffusion region 14 in the n-type epitaxial layer 12. The diffused region 13, which extends through the n-type epitaxial layer 12 to the p-type silicon substrate 11, is to be etched to form an aperture in the n-type epitaxial layer 12 so as to provide a cantilever. A silicon dioxide ($SiO_2$) insulating layer 15 is formed over the entire surface of the n-type epitaxial layer 12 remote from the p-type silicon substrate 11. A photo etching technique is used to pattern the insulating layer 15 in such a manner that the p-type diffused regions 13 and 14 and the n-type epitaxial layer 12 are exposed partially. A polysilicon layer 16 is formed on the patterned insulating layer 15 to connect the p-type diffused region 13, the p-type diffused region 14 and the n-type epitaxial layer 12. An ion implantation technique is used to dope impurities in the polysilicon layer 16 to provide a predetermined resistance between the P-type diffused regions 13 and 14. A PSG layer 17 is formed on the entire surface of the polysilicon layer 16. After a patterning technique is used to form a contact hole 18 through which the n-type epitaxial layer 12 is exposed partially, a metal electrode 19 is formed over the entire surface of the semiconductor wafer 10 remote from the silicon substrate 11. The metal electrode 19 may be made of Ta, Pt or the like not damaged by the etching solution. A protective layer 20 such as a silicon resin layer may be formed over the entire surface of the metal electrode 19.

Figure 2:
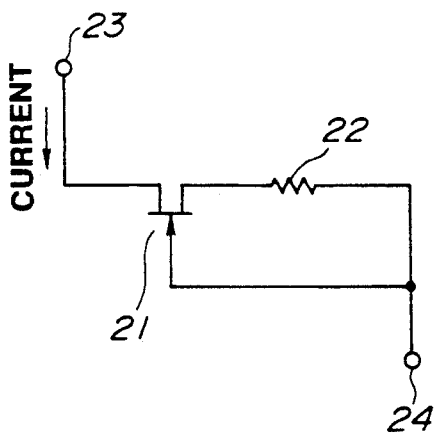
FIG. 2 is a circuit diagram showing an electric circuit equivalent to the semiconductor wafer of FIG. 1.

Referring to FIG. 2, there is shown an electric circuit equivalent to the semiconductor wafer of FIG. 1. The equivalent circuit includes a junction type FET (field effect transistor) 21 formed by the p-type diffused region 14 and the n-type epitaxial layer 12. The p-type diffused region 14 corresponds to the gate of the FET 21 and the n-type epitaxial layer 12 corresponds to the channel of the FET 21. A resistor 22, which is formed by the polysilicon layer 16, is connected to limit the current to the FET 21. That is, the resistor 22 constitutes a constant-current circuit ENC which controls the current flowing to the portion to be etched at a constant value. The FET 21 has a first terminal 23 connected to the metal electrode 19 and a second terminal 24 connected to the p-type silicon substrate 11.

Figure 3:
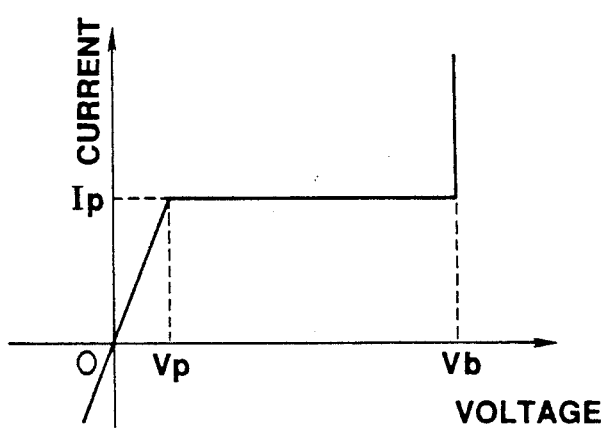
FIG. 3 is a graph of current versus voltage provided by the equivalent circuit of FIG. 2.

The operation is as follows: The semiconductor wafer 10 is immersed in an etching solution with the metal electrode 19 being connected to an external source of voltage, as shown in FIG. 13. FIG. 3 shows a graph of current versus voltage provided by the equation circuit of FIG. 2. As can be seen from FIG. 3, the current remains at the pinch off current Ip when the voltage applied from the external voltage source between the terminals 23 and 24, that is, between the metal electrode 19 and the p-type silicon substrate 11 is at a value equal to or greater than the pinch off voltage Vp and less than the breakdown voltage. At this time, the potential difference between the metal electrode 19 and the p-type silicon substrate 11 remains at a constant value. It is, therefore, possible to realize a constant-current and constant-potential condition for each of the chips of the semiconductor wafer 10 or for every a predetermined number of chips by arranging the semiconductor wafer 10 in such a manner as described in connection with FIG. 1. This is effective to provide uniform and accurate electrochemical etching.

Figure 4:
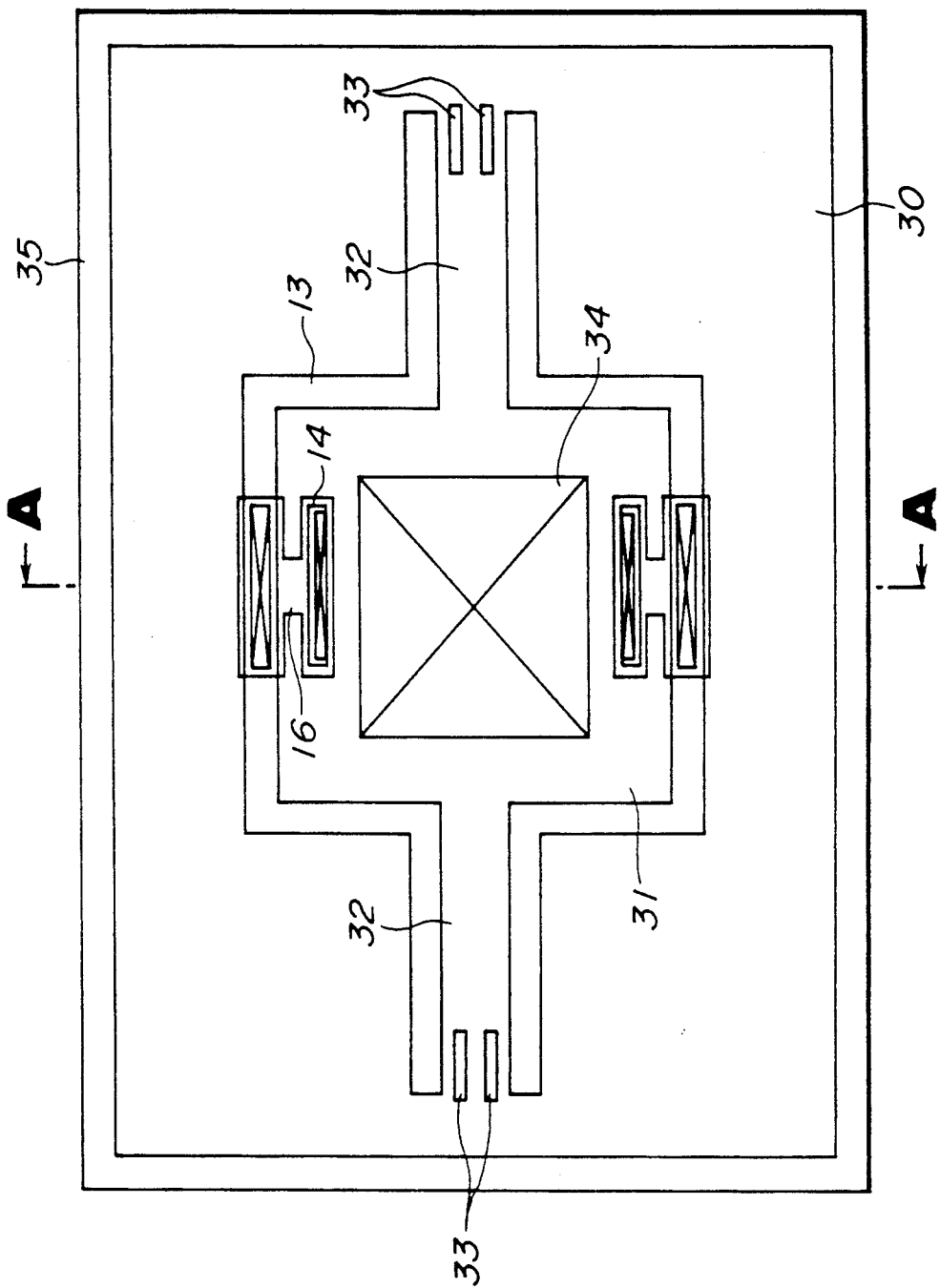
FIG. 4 is a plan view showing a pattern formed on a sensor chip of the semiconductor wafer.
Figure 5:
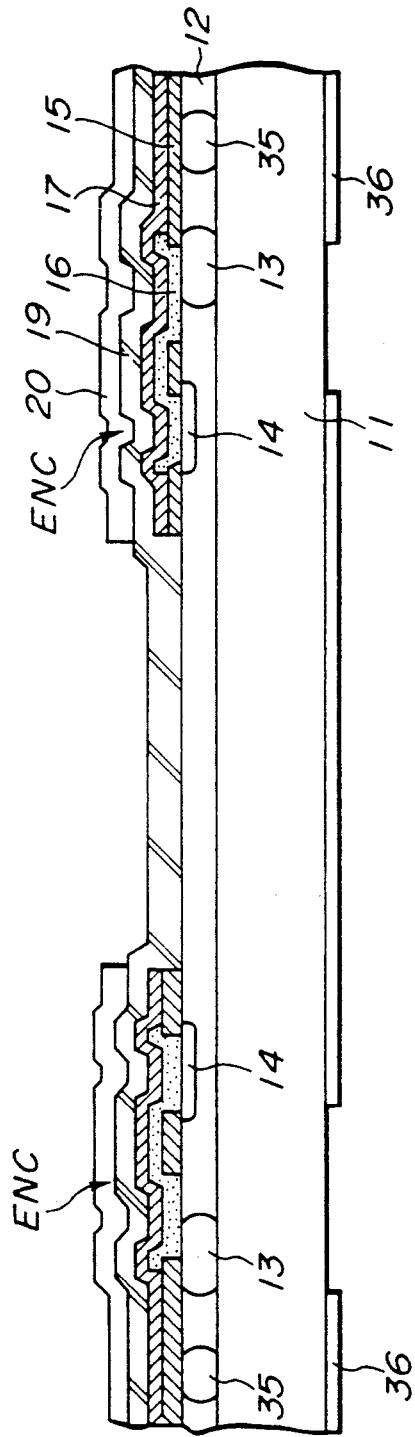
FIG. 5A is a fragmentary sectional view of the semiconductor wafer before electrochemical etching.
FIG. 5B is a fragmentary sectional view of the semiconductor wafer after electrochemical etching.

FIG. 4 shows a pattern formed on a sensor chip 30 of the semiconductor wafer 10. The sensor chip 30 is etched to produce an accelerometer including a weight 31 supported on its opposite sides by cantilevers 32. Each of the cantilevers 32 has a pair of piezoresistive elements 33 near its root. When the weight 31 is accelerated, the cantilevers 32 deflect. The piezoresistive elements 33 convert the deflections of the respective cantilevers 32 into an electric resistance change. In FIG. 4, the numeral 34 designates a contact hole through which the metal electrode 19 is connected to the silicon substrate 11 and the numeral 35 designates a $p^+$ diffused region extending through the n-type epitaxial layer 12 to the p-type silicon substrate 11. The diffusion region 35 electrically separates the sensor chip 30 from the adjacent sensor chips. Before electrochemical etching, the $p^+$ diffused region 13 remains in the sensor chip 30, as shown in FIG. 5A. The diffused region 13 is to be etched to provide an aperture defining the weight 31 and the cantilevers 32. The constant-current circuits ENC are provided to limit the current flows from the respective diffused regions 13 to the p-type silicon substrate 11. That is, the $p^+$ diffused region 14, which forms the gate of the junction type FET 21, is connected through the polysilicon layer 16 to the n-type epitaxial layer 12 and also to the $p^+$ diffused region 13. The wafer 10 is patterned with a silicon dioxide etch mask 36 to protect it from the etch.

The semiconductor wafer 10 is immersed in an etching solution with the p-type silicon substrate 11 facing to a platinum counterelectrode immersed in the etching solution. A positive potential is applied to the metal electrode 19 with respect to the counterelectrode to selectively etch the p-type silicon substrate 11 and the p-type diffused region 13 so as to produce an accelerometer as shown in FIG. 5B. If necessary, electrolytic plating is performed to form a nickel film 37 and a gold weight 38.

The constant-current circuits ENC may be formed in the weight 31, as shown in FIGS. 4 and 5A. The formation of the constant-current circuits in the weight 31 has no effect on the characteristics of the accelerometer. Although two constant-current circuits are provided for each of the sensor chips, it is to be understood that the invention is not limited to this arrangement. The constant-current circuits may be provided in a scribe line on which adjacent sensor chips are divided. The constant-current circuits may be formed to have respective resistances optimum for the corresponding sensor chips so as to provide a uniform and accurate etching performance.

Figure 6:
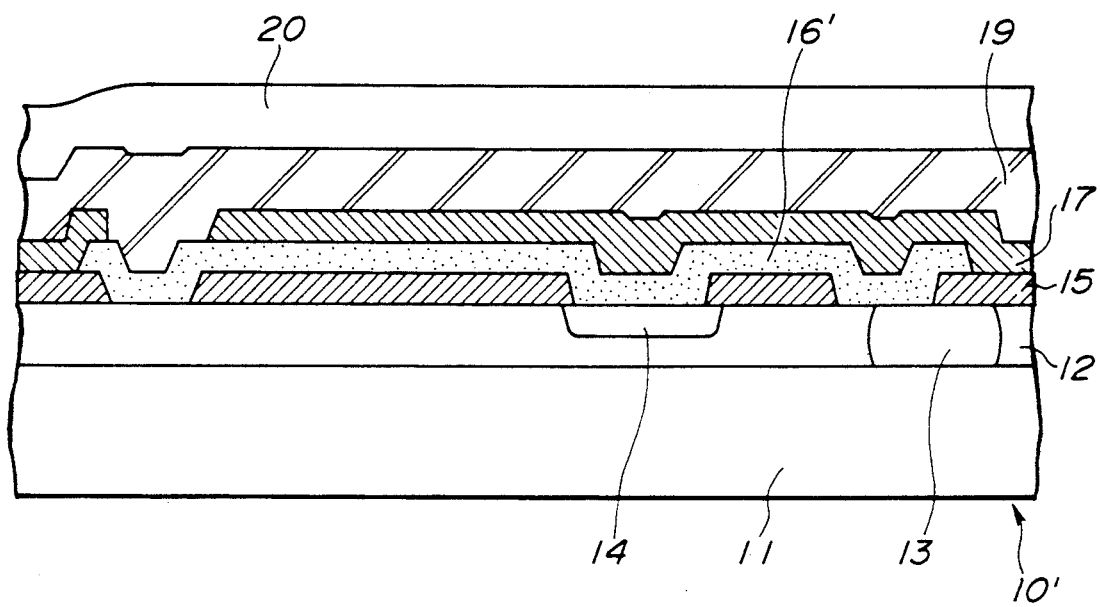
FIG. 6 is a fragmentary sectional view showing a modified form of the semiconductor wafer.

Although the semiconductor wafer 10 is used as an anode, it is to be understood that the semiconductor wafer may arranged to constitute a cathode, as shown in FIG. 6. In this case, the semiconductor wafer 10' includes a p-type silicon substrate 11 having an n-type silicon layer (epitaxial layer) 12 formed over the entire surface of the silicon substrate 11. The semiconductor wafer 10 also includes a p-type diffused region 13 formed in the n-type epitaxial layer 12 and a p-type diffusion region 14 in the n-type epitaxial layer 12. The diffused region 13, which extends through the n-type epitaxial layer 12 to the p-type silicon substrate 11, is to be etched to form an aperture in the n-type epitaxial layer 12 so as to provide a cantilever. A silicon dioxide (SiO$_2$) insulating layer 15 is formed over the entire surface of the n-type epitaxial layer 12 remote from the p-type silicon substrate 11. A photo etching technique is used to pattern the insulating layer 15 in such a manner that the p-type diffused regions 13 and 14 and the n-type epitaxial layer 12 are exposed partially. A polysilicon layer 16' is formed on the patterned insulating layer 15 to connect the p-type diffused region 13, the p-type diffused region 14 and the n-type epitaxial layer 12. An ion implantation technique is used to dope impurities in the polysilicon layer 16 to provide a predetermined resistance between the P-type diffused regions 13 and 14. A PSG layer 17 is formed on the entire surface of the polysilicon layer 16. A metal electrode 19' is formed over the entire surface. The metal electrode 19 may be made of Ta, Pt or the like not damaged by the etching solution. A protective layer 20 such as a silicon resin layer may be formed over the entire surface of the metal electrode 19'.

Figure 7:
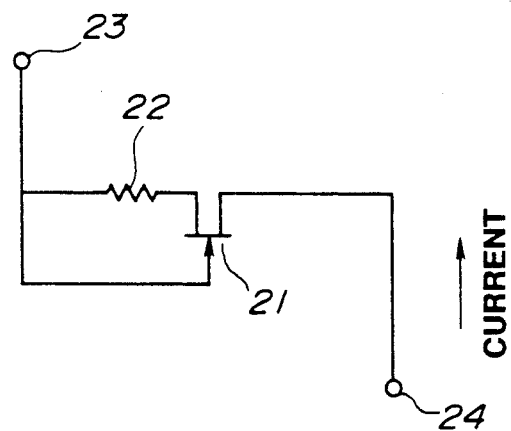
FIG. 7 is a circuit diagram showing an electric circuit equivalent to the semiconductor wafer of FIG. 6.

Referring to FIG. 7, there is shown an electric circuit equivalent to the semiconductor wafer 10' of FIG. 6. The equivalent circuit includes a junction type FET (field effect transistor) 21 formed by the p-type diffused region 14 and the n-type epitaxial layer 12. The p-type diffused region 14 corresponds to the gate of the FET 21 and the n-type epitaxial layer 12 corresponds to the channel of the FET 21. A resistor 22, which is formed by the polysilicon layer 16, is connected to limit the current to the FET 21. That is, the resistor 22 constitutes a constant-current circuit ENC which controls the current flowing to the portion to be etched at a constant value. The FET 21 has a first terminal 23 connected to the metal electrode 19' and a second terminal 24 connected to the p-type silicon substrate 11. It is to be noted that the current flows in a direction opposite to the direction shown in FIG. 2.

Figure 8:
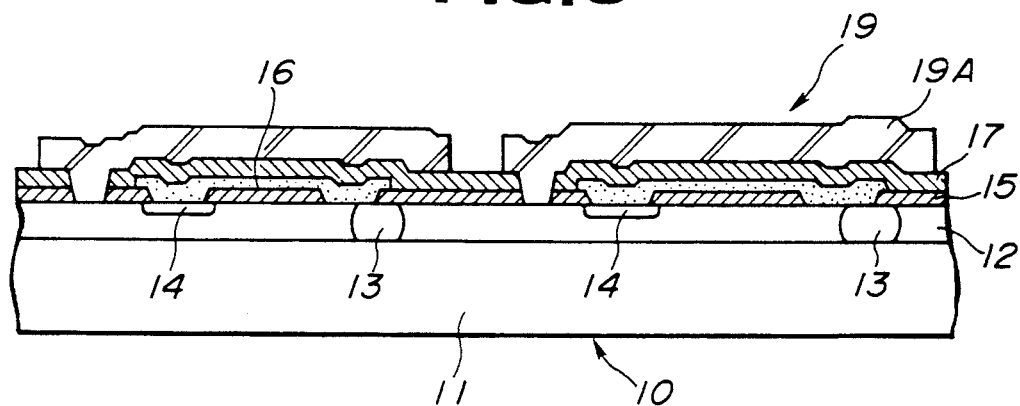
FIG. 8 is a fragmentary sectional view of a second embodiment of the semiconductor wafer of the invention.

Referring to FIG. 8, there is shown a second embodiment of the semiconductor wafer of the invention. In this embodiment, a photo etching technique is used to divide the metal electrode 19 into a number of electrode segments 19A provided for the respective sensor chips of the semiconductor wafer 10. This electrode arrangement is effective to provide an appropriate voltage control for each sensor chip or for a predetermined number of sensor chips during electrochemical etching. It is to be noted that only one constant-current circuit may be provided for a plurality of sensor chips to be etched under the same condition. Alternatively, all of the electrode segments may be connected to a common voltage source with the respective constant-current circuits being formed to have resistances optimum for the corresponding sensor chips.

Figure 9A:
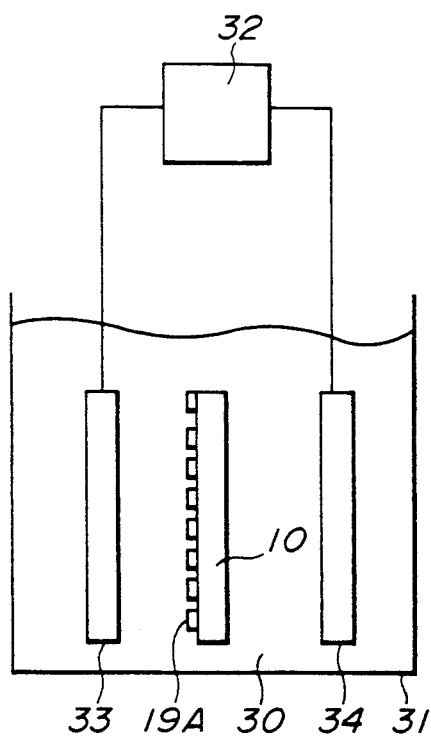
FIGS. 9A and 9B are schematic diagrams showing alternative electrochemical etching units used with the second embodiment of the invention.

Referring to FIG. 9A, there is shown an alternative electrochemical etching unit. The semiconductor wafer 10, which has a number of electrode segments 19A as shown in FIG. 8, is immersed in an etching solution 30 contained in a vessel 31. A DC voltage source 32 is provided to apply a DC voltage between electrodes 33 and 34 immersed in the etching solution 30 on the opposite sides of the semiconductor wafer 10. The electrodes 33 and 34 are made of a material such as Pt, Ta or the like not damaged by the etching solution 30. The semiconductor wafer 10 is etched electrochemically by electric charges supplied through the etching solution 30 to the metal electrodes 19A and the semiconductor wafer 10.

Figure 9B:
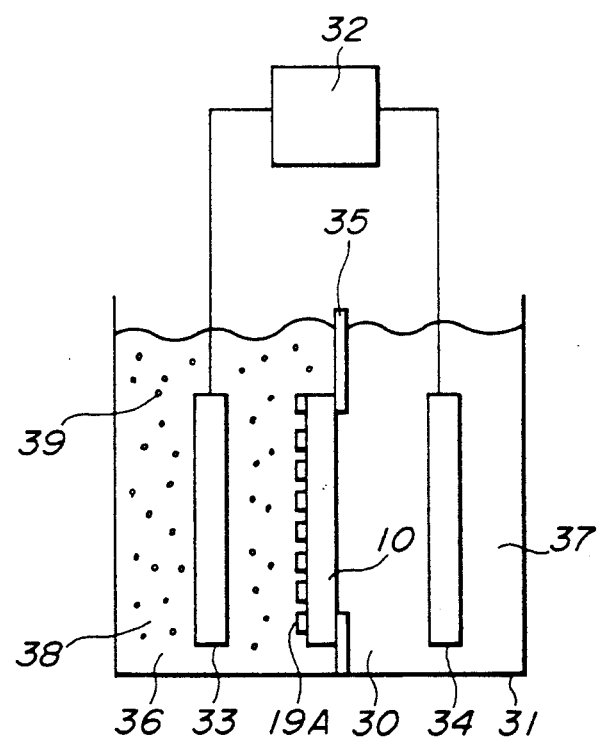

FIG. 9B shows an alternative electrochemical etching unit. The electrochemical etching unit includes a partition 35 to which the semiconductor wafer 10 is fixed to divide the vessel 30 into first and second chambers 36 and 37 on the opposite sides of the semiconductor wafer 10. The electrode segments 10A are exposed to a solution 38 contained in the first chamber 36. For example, the solution 38 may be a KCl solution or the like having a high conductivity and no etching function in order to protect the electrode segments 19A and provide a desired stable potential at a low voltage. Preferably, charged conductive particles are dispersed in the solution 38. The silicon substrate 11 of the semiconductor wafer 10 is exposed to the etching solution 30.

Figure 10A:
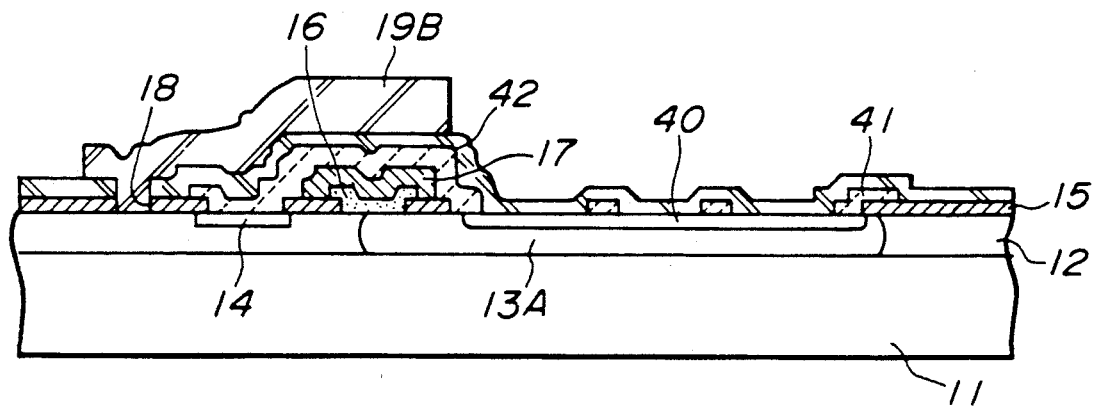
FIG. 10A is a fragmentary sectional view showing a third embodiment of the semiconductor wafer of the invention.
Figure 10B:
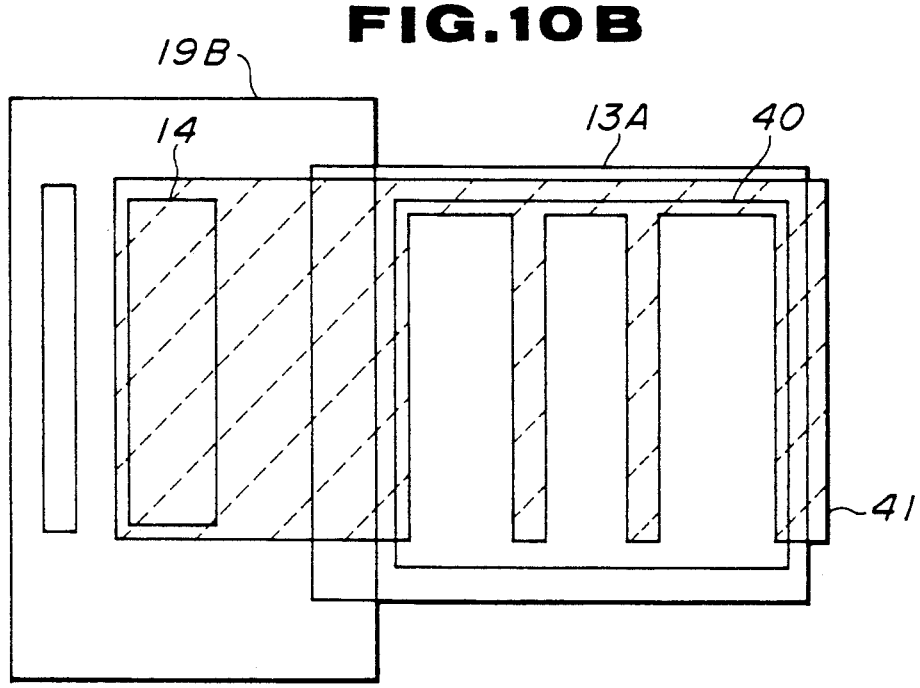
FIG. 10B is a plan view of the semiconductor wafer of FIG. 10A.

Referring to FIGS. 10A and 10B, there is shown a third embodiment of the semiconductor wafer of the invention. In this embodiment, the semiconductor wafer includes a p-type silicon substrate 11 having an n-type silicon layer (epitaxial layer) 12 formed over the entire surface of the silicon substrate 11. The semiconductor wafer also includes a p-type diffused region 13A formed in the n-type epitaxial layer 12 and a p-type diffusion region 14 in the n-type epitaxial layer 12. The diffused region 13A, which extends through the n-type epitaxial layer 12 to the p-type silicon substrate 11, has an area much greater than the p-type diffused region 13 described in connection with the first and second embodiments. The p-type diffused region 13A has an n-type diffused region 40 formed therein. The surface of the epitaxial layer 12 remote from the silicon substrate 11 is patterned, by thermaloxidation and photo-etching techniques, with a silicon dioxide layer 15 on which a polysilicon layer 16 is formed by a CVD technique. The polysilicon layer 16 has impurities doped therein so as to have a predetermined electrical resistance. A photo etching technique is used to pattern the polysilicon layer 16. CVD and photo-etching techniques are used to form a PSG layer 17 on the polysilicon layer 16. A comb-shaped Al wiring layer 41 are formed, as best shown in FIG. 10B, by vacuum-coating and photo-etching techniques. Another PSG layer 42 are then formed by CVD and photo-etching techniques. A metal electrode 19B is formed, by sputter-deposition and photo-etching techniques, on the PSG layer 42 except above the p-type diffused layer 13A. The metal electrode 19B is connected through a contact hole 18 to the n-type epitaxial layer 12. This structure is formed for each of segments into which the semiconductor wafer is divided, as described in connection with the second embodiment.

Figure 11:
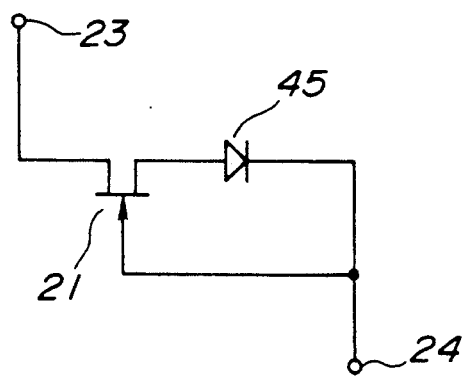
FIG. 11 is a circuit diagram showing an electric circuit equivalent to the semiconductor wafer of FIG. 10A.

Referring to FIG. 11, there is shown an electric circuit equivalent to the semiconductor wafer of FIGS. 10A and 10B. The equivalent circuit includes a junction type FET (field effect transistor) 21 and a diode 45. The FET 21 has a channel formed by the n-type epitaxial layer 12 and a gate formed by the p-type diffused layer 14. The diode 45 is formed by the p-n junction of the p-type diffused region 13A and the n-type diffused region 40. Since the Al wiring layer 41 connected to the n-type diffused layer 40 is formed in a comb shape, the diode 45 can be exposed to light. The electric conductivity of the diode 45 is dependent upon the time and intensity of light irradiation. It is, therefore, possible to design the diode 45 to have a desired electric conductivity.

Figure 12A:
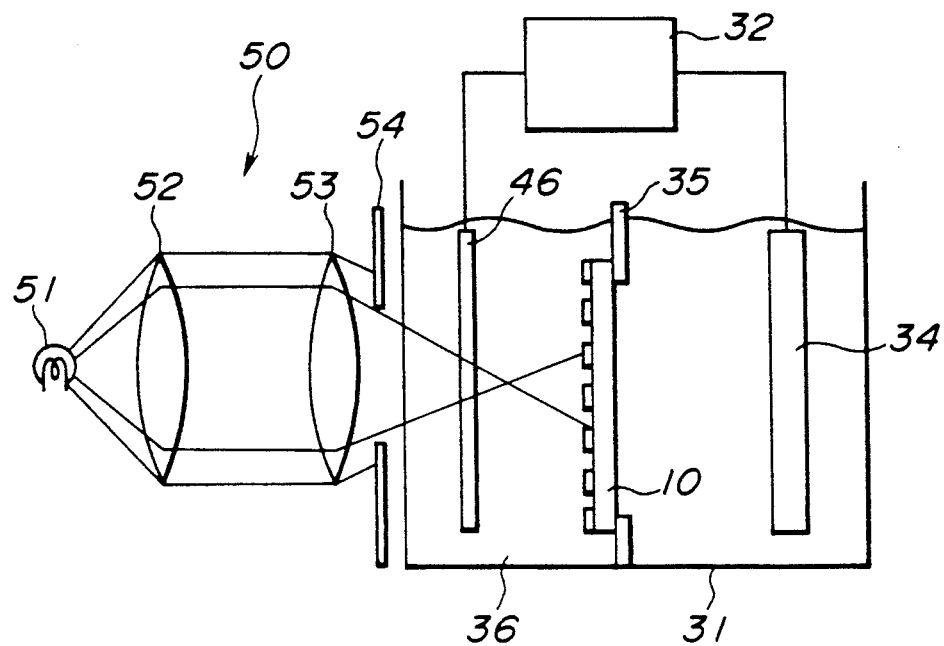
FIGS. 12A and 12B are schematic diagrams showing different electrochemical etching units for use with the third embodiment of the invention.

Referring to FIG. 12A, there is shown an electrochemical etching unit used with the third embodiment of the semiconductor wafer of the invention. The semiconductor wafer 10, which has a number of electrode segments 19B, is immersed in an etching solution 30 contained in a vessel 31. A DC voltage source 32 is provided to apply a DC voltage between electrodes 46 and 34 positioned on the opposite sides of the semiconductor wafer 10. The electrode 46 is a transparent electrode immersed in the solution 38 such as a KCl solution. The electrode 34 is immersed in the etching solution 30. Light is radiated onto the electrode segments 19B through the transparent electrode 46 from a lighting unit 50. The lighting unit 50 includes a light source 51, a combination of lenses 52 and 53, and an iris 54. The principal rays are parallel to the optic axis. The light is radiated from the light source 51 through the lens combination onto the central portion of the semiconductor substrate 10 to change the electric conductivities of the diodes 45 placed on the central portion of the semiconductor substrate 10. As a result, a higher voltage is applied to the central portion of the semiconductor wafer 10 as compared to its peripheral portion. Consequently, a higher etch rate is achieved for the central portion of the semiconductor wafer 10 than the peripheral portion thereof. This is effective to uniformly distribute etch rates over the entire area of the semiconductor wafer 10.

The light source 51 may be arranged to generate light in a pulsation form to control the current through the semiconductor wafer 10 so as to uniformly etch the surface of the semiconductor wafer 10.

Figure 12B:
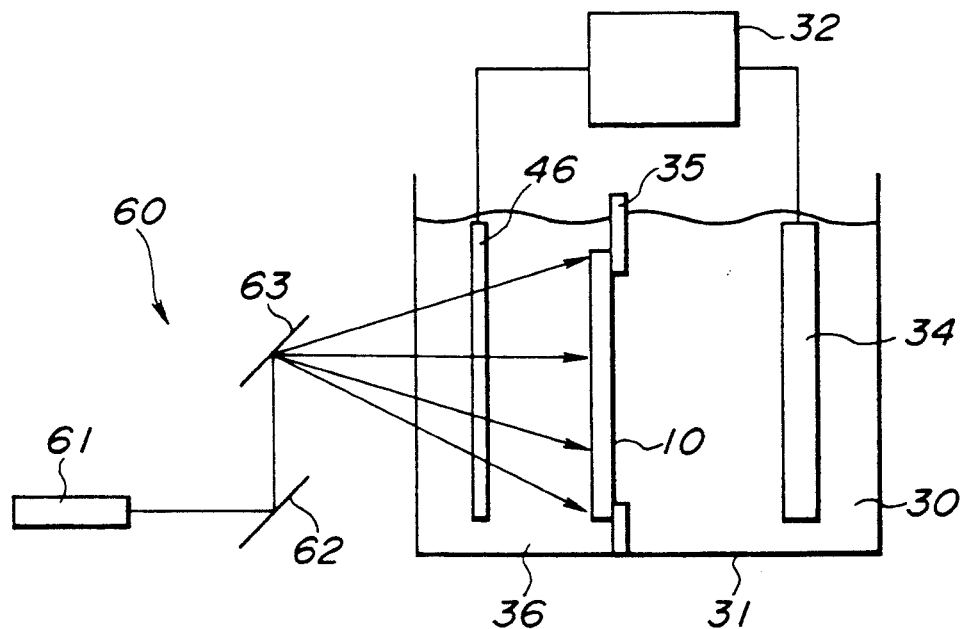

Referring to FIG. 12B, there is shown an alternative electrochemical etching unit which is substantially the same as shown in FIG. 12A except for the lighting unit. In FIG. 2, the lighting unit is taken in the form of a scanner 60 which includes a laser beam generator 61, and X and Y mirrors 62 and 63. A homochromatic laser beam generated from the laser beam generator 61 is obliquely incident on the X mirror 62. The Y mirror 63 is positioned in the path of the incident beam reflected from the X mirror 62 to further reflect the reflected beam in a direction produced a light spot on the semiconductor wafer 10. In order to scan the whole area of the semiconductor wafer 10, the scanner 60 also includes an X motor (not shown) for rotating the X mirror 62 to move the light spot in an X direction on the semiconductor wafer 10, and a Y motor (not shown) for rotating the Y mirror 63 to move the light spot in a Y direction on the semiconductor wafer 10. The scanner 60 can obtain the same effect as described in connection with FIG. 12A.

In this embodiment, the etching process is free from power noise problems which may occur when the voltage control for the semiconductor wafer 10 is made by switching the line from the voltage source 32. Although the diode 45 has been described as a p-n junction type diode, it is to be noted that it may be a PIN diode to improve the switching characteristics during pulse driving modes.

What is claimed is:

1. A semiconductor wafer including a plurality of chips each having at least one portion to be etched electrochemically with application of an electric voltage to said semiconductor wafer immersed in an etching solution, said semiconductor wafer including means formed therein for controlling electric energy applied to respective portions of said chips independently.

2. The semiconductor wafer as claimed in claim 1, wherein said means includes constant-current circuits for controlling current flows to said respective portions.

3. The semiconductor wafer as claimed in claim 1, wherein said semiconductor wafer has an electrode formed over one surface thereof for connection to a voltage source.

4. The semiconductor wafer as claimed in claim 3, wherein said means includes constant-current circuits connected to said electrode for controlling current flows to said respective portions.

5. The semiconductor wafer as claimed in claim 1, wherein said semiconductor wafer has electrodes formed on one surface thereof, and wherein said means includes constant-current circuits connected to said respective electrodes for controlling current flows to the respective portions.

6. A semiconductor wafer including a plurality of chips having respective portions to be etched electrochemically with application of an electric voltage to said semiconductor wafer immersed in an etching solution, said semiconductor wafer including light sensitive diodes formed therein for controlling current flows to said respective portions, each of said diodes having an electric conductivity variable when exposed to light.

7. A semiconductor wafer including a plurality of chips having respective portions to be etched electrochemically with application of an electric voltage to said semiconductor wafer immersed in an etching solution, said semiconductor wafer having electrodes formed on one surface thereof, said semiconductor wafer including light sensitive diodes formed therein connected to said respective electrodes for controlling current flows to said respective portions, each of said diodes having an electric conductivity variable in response to light.

8. A semiconductor wafer including a plurality of chips each having at least one portion to be etched electrochemically with application of an electric voltage to said semiconductor wafer immersed in an etching solution, said semiconductor wafer including means formed therein for controlling current flows to the respective portions of said chips to provide a constant-current and constant-potential condition for each of said chips.

9. The semiconductor wafer as claimed in claim 8, wherein said means includes constant-current circuits for controlling current flows to said respective portions.

10. The semiconductor wafer as claimed in claim 8, wherein said semiconductor wafer has an electrode formed over one surface thereof for connection to a voltage source and wherein said means includes constant-current circuits connected to said electrode for controlling the current flows to said respective portions.

11. A semiconductor wafer including a plurality of chips each having at least one portion to be etched electrochemically with application of an electric voltage to said semiconductor wafer immersed in an etching solution, said semiconductor wafer including means formed therein for controlling current flows to the respective portions of said chips to provide a constant-current and constant-potential condition for every predetermined number of said chips.

13. The semiconductor wafer as claimed in claim 11, wherein said means includes constant-current circuits for controlling current flows to said respective portions.

13. The semiconductor wafer as claimed in claim 11, wherein said semiconductor wafer has an electrode formed over one surface thereof for connection to a voltage source and wherein said means includes constant-current circuits connected to said electrode for controlling the current flows to said respective portions.

* * * * *